United States Patent
Mansour

(10) Patent No.: US 8,582,908 B2
(45) Date of Patent: Nov. 12, 2013

(54) QUANTIZATION METHOD AND APPARATUS

(75) Inventor: Mohamed Mansour, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 670 days.

(21) Appl. No.: 12/184,873

(22) Filed: Aug. 1, 2008

(65) Prior Publication Data

US 2009/0041367 A1 Feb. 12, 2009

Related U.S. Application Data

(60) Provisional application No. 60/954,526, filed on Aug. 7, 2007.

(51) Int. Cl.
*G06K 9/00* (2006.01)
(52) U.S. Cl.
USPC .......................................... 382/252; 382/253

(58) Field of Classification Search
USPC .......................... 382/251, 252, 253; 341/143
See application file for complete search history.

(56) References Cited

U.S. PATENT DOCUMENTS

| 2004/0102968 | A1* | 5/2004 | Tian et al. | 704/226 |
| 2005/0035965 | A1* | 2/2005 | Sloan et al. | 345/426 |
| 2005/0162285 | A1* | 7/2005 | Melanson | 341/50 |
| 2007/0018994 | A1* | 1/2007 | Sekine | 345/582 |

* cited by examiner

*Primary Examiner* — Amir Alavi
*Assistant Examiner* — Kenny Cese
(74) *Attorney, Agent, or Firm* — Mirna Abyad; W. James Brady; Frederick J. Telecky, Jr.

(57) ABSTRACT

Quantization for oversampled signals with an error minimization searches based upon clusters of possible sampling vectors where the clusters have minimal correlation and thereby decrease reconstruction error as a function of oversampling (redundancy) ratio.

4 Claims, 4 Drawing Sheets

QUANTIZATION METHOD AND APPARATUS

CROSS-REFERENCE TO RELATED APPLICATIONS

This application claims priority from provisional application No. 60/954,526, filed Aug. 7, 2007, which is herein incorporated by reference.

BACKGROUND OF THE INVENTION

The present invention relates to digital signal processing, and more particularly to architectures and methods for oversampling quantization such as in analog-to-digital conversion.

Analog-to-digital converters (ADCs) are used to convert analog signals, such as music or voice, to digital format to allow for compression (e.g., MP3) and transmission over digital networks. An ADC samples an input analog signal (makes discrete in time) and quantizes the samples (makes discrete in amplitude) to give a sequence of digital words. For playback, a digital-to-analog converter (DAC) reconstructs (approximately) the input analog signal from the sequence of digital words. If the sampling rate of the ADC is higher than the Nyquist rate for the input analog signal, then the sampling is essentially reversible; whereas, the quantization always loses information. Thus ADC have a problem of optimal quantization.

A commonly used type of ADC includes oversampling plus a sigma-delta modulator; FIG. 3A illustrates one possible implementation of a one-stage modulator and quantizer. In particular, input signal x(t) is oversampled to give the input digital sequence x(nT) which will be quantized to give the output quantized digital sequence y(nT). The modulator operation includes subtracting a scaled and delayed quantization error, $c\ e((n-1)T)$, from the input samples prior to quantization; this feedback provides integration of the overall quantization error. That is, $$y(nT)=Q(u(nT))$$

$$e(nT)=y(nT)-u(nT)$$

$$u(nT)=x(nT)-c\ e((n-1)T)$$

Recursive substitution gives:

$$e(nT)=y(nT)-x(nT)+c[y((n-1)T)- x((n-1)T)]++\ldots+c^k[y(n-k)T)-x((n-k)T)]+\ldots$$

See Boufounos and Oppenheim, Quantization Noise Shaping on Arbitrary Frame Expansion, Proc. ICASSP, vol. 4, pp. 205-208 (2005) which notes an optimal value for the scaling constant c as $\sin c(1/r)$ where r is the oversampling ratio.

SUMMARY OF THE INVENTION

The present invention provides quantization for oversampled signals with an error minimization search based on clusters of possible sampling vectors.

DESCRIPTION OF THE PREFERRED EMBODIMENTS

1. Overview

Figure 1A:
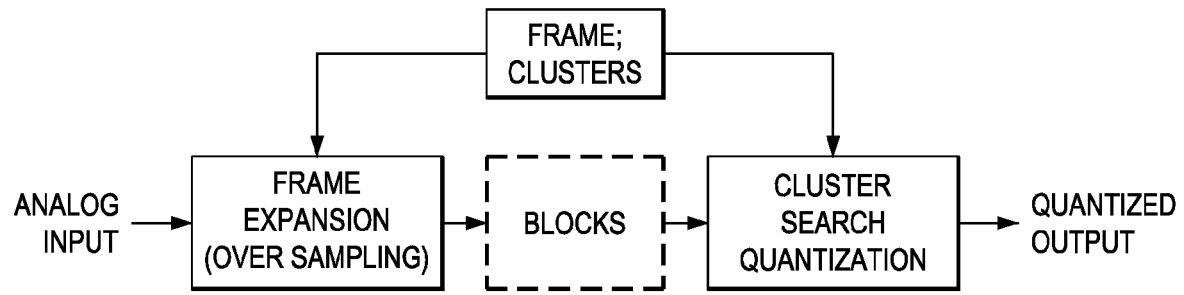
FIGS. 1A-1B illustrate a preferred embodiment system and method.

Preferred embodiment oversampling quantization methods cluster possible quantization vectors according to correlations and search clusters to determine quantization to minimize reconstruction errors. FIG. 1A shows functional blocks of a system (e.g., an ADC) using the quantization method.

Figure 3A:
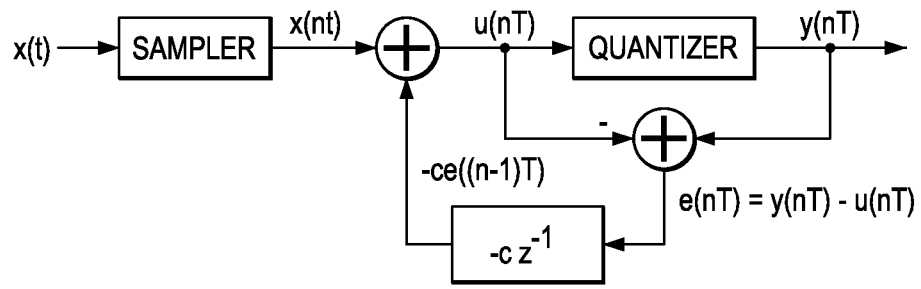
FIGS. 3A-3C show an ADC, a processor, and network communication.
Figure 3C:
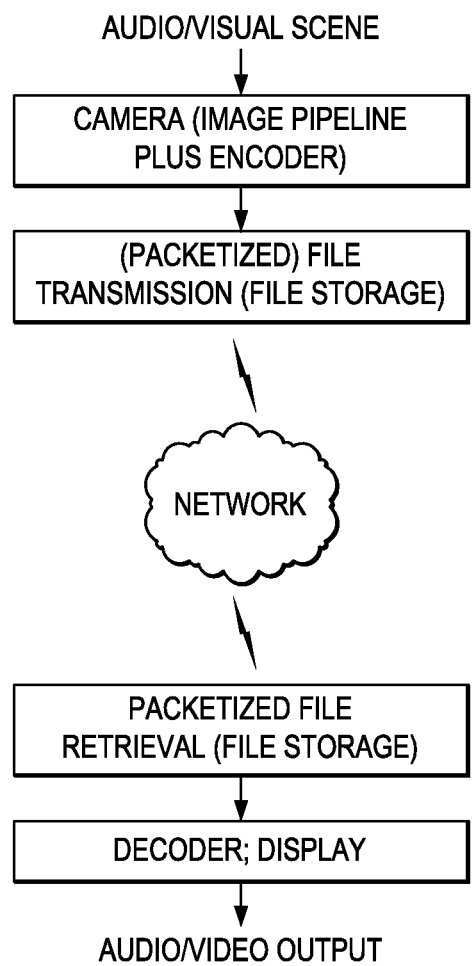
Figure 3B:
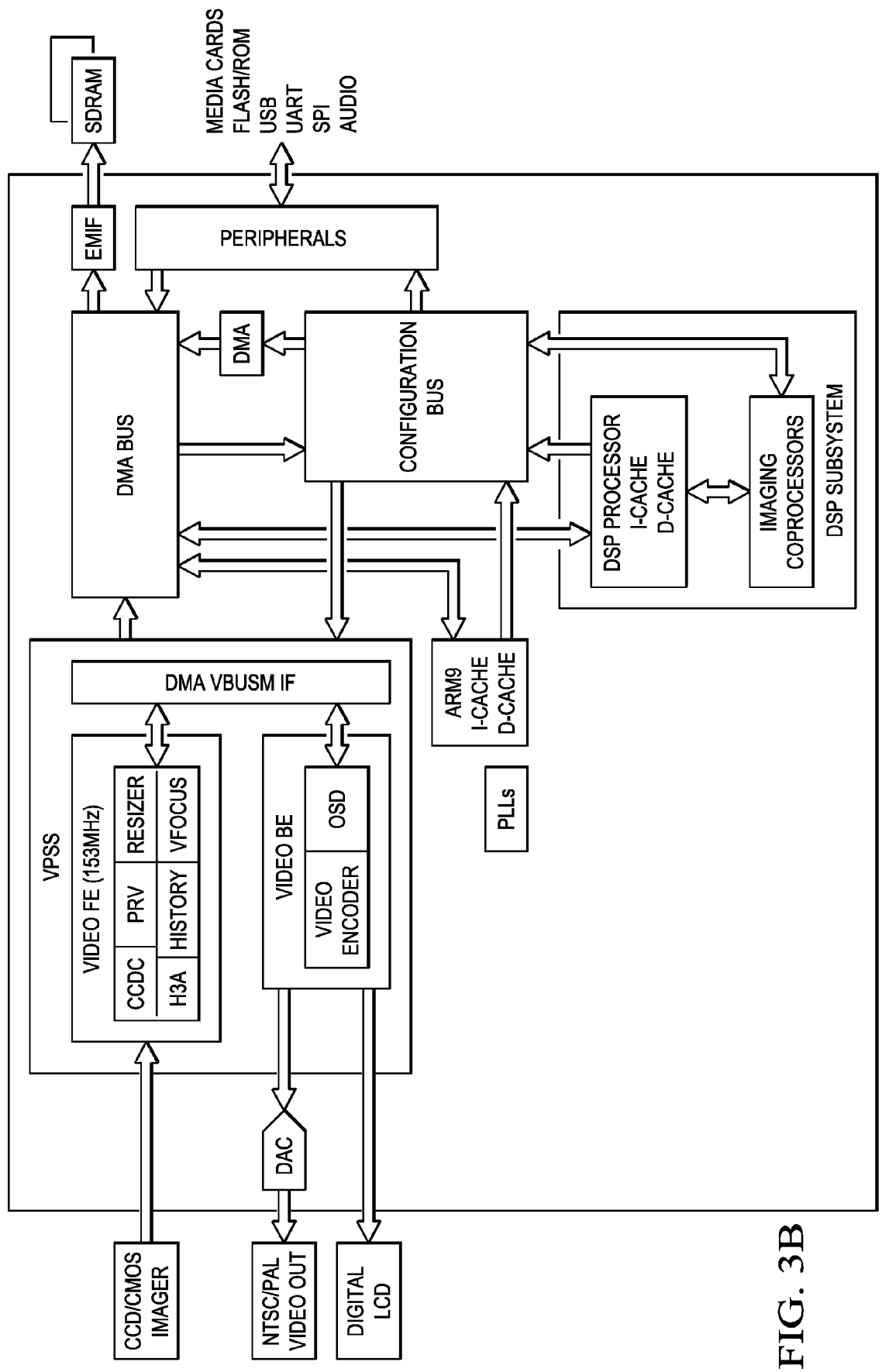

Preferred embodiment systems (pipelined delta-sigma analog-to-digital converters, etc.) perform preferred embodiment methods with any of several types of hardware: digital signal processors (DSPs), general purpose programmable processors, application specific circuits, or systems on a chip (SoC) such as combinations of a DSP and a RISC processor together with various specialized programmable accelerators. FIG. 3B is an example of digital camera hardware including various ADCs. A stored program in an onboard or external (flash EEP)ROM or FRAM could implement the signal processing. Preferred embodiment analog-to-digital converters and digital-to-analog converters can provide coupling to the real world, modulators and demodulators (plus antennas for air interfaces) can provide coupling for transmission waveforms, and packetizers can provide formats for transmission over networks such as the Internet; see FIG. 3C.

2. Sampling Theorem Background

Preliminarily, recall that the sampling theorem provides for exact reconstruction of x(t), a finite-energy and bandwidth-limited signal, from samples taken at the Nyquist rate or a higher rate. In particular, with x(t) in the subspace of $L^2(R)$ of functions with spectrum limited to $-1/(2T)<f<1/(2T)$ where f is the frequency variable and T is a sampling interval (so the sampling rate is 1/T):

$$x(t)=\Sigma_{n\in Z} x(nT)\sin c(t/T-n)$$

where $\sin c(u)=\sin(\pi u)/\pi u$ and Z denotes the set of integers.

The samples can be written in terms of an inner product in $L^2(R)$ as follows. Let X(f) be the Fourier transform of x(t); then using the limit on the bandwidth of x(t) gives $$x(nT) = \int_{-\infty,\infty} X(f)e^{2\pi i fnT} df$$

$$= \int_{-\infty,\infty} X(f)rect(fT)e^{2\pi i fnT} df$$

where rect(u) denotes the rectangle function which equals 1 for $-\frac{1}{2}<u<\frac{1}{2}$ and 0 elsewhere. Then applying Parseval's theorem gives:

$$x(nT)=\int_{-\infty,\infty} x(t)(1/T)\sin c(t/T-n) dt$$

where we used the Fourier transform of $(1/T)\sin c(t/T-n)$ is $rect(fT)e^{-2\pi i fnT}$. Then the integral can be interpreted as the inner product in $L^2(R)$:

$$x(nT)=\langle x(t)|(1/T)\sin c(t/T-n)\rangle$$

Note that the functions $\sin c(t/T-n)$ are orthogonal:

$$\langle \sin c(t/T-m)|\sin c(t/T-n)\rangle = T^2\int_{-\infty,\infty} rect(fT)$$

$$e^{-2\pi i fmT}rect(fT)e^{2\pi i fnT} df$$

$$= T^2\int_{-\infty,\infty} rect(fT)e^{2\pi i f(n-m)T} df$$

$$= T\operatorname{sinc}(n-m)$$
$$= T\delta_{m,n}$$

Thus the sampling theorem states that the set of functions $\operatorname{sinc}(t/T-n)$ for $n=0, \pm 1, \pm 2, \ldots$ constitutes an orthogonal basis for H, the subspace of $L^2(R)$ consisting of functions with spectrum in $-1/(2T) < f < 1/(2T)$. That is, the sampling theorem for H provides:

$$x(t) = \Sigma_{n \in Z} \langle x(.) | \phi_{analysis,n}(.) \rangle \phi_{synthesis,n}(t)$$

where the synthesis functions are $\phi_{synthesis,n}(t) = \operatorname{sinc}(t/T-n)$ and the analysis functions are $\phi_{analysis,n}(t) = (1/T)\operatorname{sinc}(t/T-n)$ for the space of bandlimited signals.

This may also be interpreted as the analysis linear mapping $F: H \to l^2(Z)$ with $F(x(t)) = x$ where the components of vector $x$, $x_n = \langle x(t) | \phi_{analysis,n}(t) \rangle$, are the samples of $x(t)$, together with the adjoint synthesis linear mapping $F^*: l^2(Z) \to H$ defined by $F^*(c) = \Sigma_{n \in Z} c_n \phi_{synthesis,n}(t)$. Of course, F is one-to-one but not onto, $F^*$ is not one-to-one, and the operator norm of F depends upon the sampling rate: $\|F(x(t))\|^2 = (1/T)\|x(t)\|^2$.

3. Oversampling

For sampling $x(t)$ in H at rates higher than the Nyquist rate, such as oversampling by a (redundancy) factor of $r > 1$, the corresponding samples, $x(nT/r)$, could still be expressed as inner products of $x(t)$ with the corresponding analysis functions $(1/T)\operatorname{sinc}(t/T-n/r)$, and $x(t)$ could still be expanded as a sum of synthesis functions $(1/r)\operatorname{sinc}(t/T-n/r)$ where the $1/r$ factor comes from the fact that each of r subsets of the functions $\operatorname{sinc}(t/T-n/r)$ with the same n mod r suffices (by the sampling theorem) to reconstruction $x(t)$ and so the total sum gives r times $x(t)$. However, these sets of functions are overcomplete in the sense that the expansion coefficients are not unique for $x(t)$ in H, and the functions no longer form orthogonal sets:

$$\langle \operatorname{sinc}(t/T-m/r) | \operatorname{sinc}(t/T-n/r) \rangle = T\operatorname{sinc}(n/r-m/r)$$

As a simple example, for $r=2$ and $T=1$ the analysis functions are the $\operatorname{sinc}(t-n/2)$. Then the samples of $x(t)$ at integers and half-integers are:

$$x(m) = \langle x(t) | \operatorname{sinc}(t-m) \rangle$$

$$x(m+\tfrac{1}{2}) = \langle x(t) | \operatorname{sinc}(t-(m+\tfrac{1}{2})) \rangle$$

The sampling theorem provides that each of these sets of samples is sufficient for reconstruction:

$$x(t) = \sum_{m \in Z} x(m)\operatorname{sinc}(t-m)$$
$$= \sum_{m \in Z} 2x(m)(1/2)\operatorname{sinc}(t-m)$$

$$x(t) = \sum_{m \in Z} x(m+1/2)\operatorname{sinc}(t-(m+1/2))$$
$$= \sum_{m \in Z} 2x(m+1/2)(1/2)\operatorname{sinc}(t-(m+1/2))$$

Thus the expansion in terms of the overcomplete set is not unique; indeed $$x(t) = \Sigma_{n \in Z} c_n (1/2)\operatorname{sinc}(t-n/2)$$

where a first possible set of expansion coefficients is: $c_n = x(n/2)$ (which is the vector $F(x(t))$), a second possible set is $c_n = 2x(n/2)$ for n even and $c_n = 0$ for n odd; and a third possible set is: $c_n = 0$ for n even and $c_n = 2x(n/2)$ for n odd. In fact, the set of expansion coefficients $c_n = x(n/2)$ for n even and $c_n = -x(n/2)$ for n odd makes the sum 0; that is, $\Sigma_{n \in Z}(-1)^n x(n/2)(1/2)\operatorname{sinc}(t-n/2) = 0$.

4. Frames

In general, let H denote $L^2(R)$ or a subspace of $L^2(R)$; then a set $\{\phi_j\}_{j \in J}$ is a frame of H if there exist two positive numbers $A_1, A_2$ such that for any x in H we have $$A_1 \|x\|^2 \leq \Sigma_{j \in J} |\langle x | \phi_j \rangle|^2 \leq A_2 \|x\|^2$$

A frame is called "tight" when $A_1 = A_2$. The examples of the preceding sections, $\phi_j = \operatorname{sinc}(t/T-j/r)$, are tight frames with $A = rT$. Frames can be viewed as a generalization of bases of a Hilbert space. If $\{\phi_j\}_{j \in J}$ is a frame, then any element x in H can be expressed as $$x = \Sigma_{j \in J} c_j \phi_j$$

where the expansion coefficients $c = \{c_j\}_{j \in J}$ may be considered an element of $l^2(Z)$ but may not be unique if the frame is overcomplete, such as for the example of preceding section 3.

The frame analysis operator, $F: H \to l^2(Z)$, and its adjoint (frame synthesis) operator, $F^*: l^2(Z) \to H$, are defined by:

$$F(x) = \{\langle x | \phi_j \rangle\}_{j \in J}$$

$$F^*(c) = \Sigma_{j \in J} c_j \phi_j$$

Note that when $h = \{h_j\}_{j \in J}$ is in ker($F^*$), the kernel (null space) of $F^*$, then $c+h$ also is a set of expansion coefficients for x:

$$x = \Sigma_{j \in J}(c_j + h_j)\phi_j$$

Of course, h being in ker($F^*$) is the same as h being perpendicular to ran(F), the range of F, in $l^2(Z)$. Note that ran(F) is the subspace of vectors which consist of samples of functions in H.

Define the frame operator, $F^*F: H \to H$, so $F^*F(x) = \Sigma_{j \in J} \langle x | \phi_j \rangle \phi_j$. Then the dual frame, $\{\phi_{dual,j}\}_{j \in J}$, is defined as the frame operator inverse image of the frame:

$$\phi_{dual,j} = (F^*F)^{-1}\phi_j$$

For tight frames we have $\phi_{dual,j} = \phi_j/A$ where A is the frame bound.

One possible set of expansion coefficients of particular importance is the minimum-norm-in-$l^2(Z)$ solution, which is computed as:

$$\hat{c}_j = \langle x | \phi_{dual,j} \rangle$$

Any other set of expansion coefficients for x can be expressed as $$c = \hat{c} + \Sigma_n \gamma_n v^{(n)}$$

where the $v^{(n)}$ form an orthonormal basis for ker($F^*$) as a subspace of $l^2(Z)$.

5. Quantization for Reconstruction

Quantization of samples for an oversampling ADC corresponds to quantization of expansion coefficients of the signal $x(t)$ with respect to the frame corresponding to the oversampling (e.g., $\operatorname{sinc}(t/T-n/r)$); and the preferred embodiment methods minimize the reconstruction error due to the quantization of the frame expansion coefficients. First, define the quantization error for vector c in $l^2(Z)$ as the vector $Q_{error}(c)$ in $l^2(Z)$ $$Q_{error}(c) = c + \Sigma_n \gamma_n v^{(n)} - (\lfloor c \rfloor + \alpha)$$

where $\lfloor . \rfloor$ denotes the floor function (largest integer not greater than) and $\alpha$ is an integer vector that corresponds to the quantization approximation. For example, when $Q(c_j) = \lfloor c_j \rfloor$, then $\alpha_j = 0$; whereas, when $Q(c_j) = \lceil c_j \rceil$, then $\alpha_j = 1$. $\lceil . \rceil$ denotes the ceiling function (smallest integer not less than), and the $c_j$ are presumed normalized by the quantization step size. In effect, $Q(c_j)=\lfloor c_j \rfloor+\alpha_j$, and $Q_{error}(c)=c-Q(c)+\Sigma_n \gamma_n v^{(n)}$ where, as before, the $v^{(n)}$ form an orthonormal basis for ker(F*). Let $$e=c-\lfloor c \rfloor$$

so e is the integer truncation error vector. Then the reconstruction error in H is:

$$\begin{aligned} e^{(rec)} &= F^*(Q_{error}(c)) \\ &= F^*(e-\alpha) \\ &= \sum_{j \in J}(e_j - \alpha_j)\varphi_j \end{aligned}$$

Therefore the reconstruction optimization problem can be written as minimizing the objective function $$\begin{aligned} \Psi &= \|e^{(rec)}\|^2 \\ &= \langle F^*(e-\alpha) | F^*(e-\alpha) \rangle \\ &= \langle L^{(rec)}(e-\alpha) | e-\alpha \rangle \end{aligned}$$

where $L^{(rec)}=FF^*$. The following sections 9-11 provide approximate solutions of the optimization problem.

6. Minimizing Error After Linear Operation

If the frame coefficients undergo a known linear operation, e.g., linear filtering, prior to frame synthesis, then the above formulation needs to be modified to accommodate this linear operation. Assume that a linear operator S: $l^2(Z) \to l^2(Z)$ is applied to the original frame coefficients c. The reconstructed signal has the general form:

$$x=F^*S(c)$$

Therefore the earlier formulation of the optimization problem still applies and we get the optimization model:

$$\begin{aligned} \Psi &= \langle F^*S(e-\alpha) | F^*S(e-\alpha) \rangle \\ &= \langle L^{(linear)}(e-\alpha) | e-\alpha \rangle \end{aligned}$$

where $$L^{(linear)}=S^*FF^*S$$

Where S* is the adjoint operator of S. Note that with the above formulation, we minimize the reconstruction error after the linear operator even though the quantization takes place before the linear operator.

7. Minimizing Quantization Error

The objective function for minimization of the quantization error in $l^2(Z)$ is:

$$\begin{aligned} \Psi &= \|Q_{error}(c)\|^2 \\ &= \|\gamma + (e-\alpha)\|^2 \end{aligned}$$

where $\gamma = \Sigma_n \gamma_n v^{(n)}$ is in ker(F*). For any value of $\alpha$ the value of $\gamma$ that yields the minimization is equivalent to the projection of $e-\alpha$ onto ker(F*) in $l^2(Z)$; i.e., $$\gamma_j = -\langle e-\alpha | v^{(j)} \rangle$$

Define the projection operation P: $l^2(Z) \to $ ker(F*) as $$P(c)=\Sigma_j \langle c | v^{(j)} \rangle v^{(j)}$$

Then the objective function can be rewritten as:

$$\Psi \|(I-P)(e-\alpha)\|^2$$

Note that I−P is the orthogonal projection operator onto ran (F); hence, it is a self-adjoint operator. Therefore, the optimization problem has the same form as the previous but with $$\begin{aligned} L^{(quant)} &= (I-P)^2 \\ &= (I-P) \end{aligned}$$

Note that:

$$\|e^{(rec)}\| = \|F^*Q_{error}(c)\| \leq \|F^*\| \|Q_{error}(c)\|$$

where $\|F^*\|$ denotes the usual operator norm $\sup_{\|c\|=1} \|F^*(c)\|$. Thus there is a direct proportion between the minimization of the quantization error and the minimization of the reconstruction error.

8. Optimization

The optimizations of preceding sections 5-7 all have the same form with an operator L which is a positive, self-adjoint operator in $l^2(Z)$. L is also a compact operator because it is the limit of a sequence of finite-rank approximation operators due to the frame definition upper bound; e.g., for $L^{(rec)}$ we have $$L^{(rec)}(c)_k = \langle \Sigma_{j \in J} c_j \phi_j | \phi_k \rangle$$

Next, define the finite rank approximation $L_n$ as $$\begin{aligned} L_n(c)_k &= \langle \sum_{j \leq n} c_j \varphi_j | \varphi_k \rangle \quad \text{if } k \leq n \\ &= 0 \quad \text{if } k > n \end{aligned}$$

Then $$\begin{aligned} (L^{(rec)}-L_n)(c)_k &= \langle \sum_{j>n} c_j \varphi_j | \varphi_k \rangle \quad \text{if } k \leq n \\ &= L^{(rec)}(c)_k \quad \text{if } k > n \end{aligned}$$

The operator norm is:

$$\|(L^{(rec)}-L_n)\| = \sup_{\|c\|=1} \|(L^{(rec)}-L_n)(c)\|$$

So squaring and using the frame definition:

$$\begin{aligned} \|(L^{(rec)}-L_n)\|^2 &= \sup_{\|c\|=1} \|(L^{(rec)}-L_n)(c)\|^2 \\ &= \sup_{\|c\|=1} \sum_{i,j>n} |c_j \langle \varphi_i | \varphi_j \rangle|^2 < A_2 \max(\|\varphi_j\|^2) \sum_{i>n} |c_i|^2 \end{aligned}$$

And $$\sum_{i>n} |c_i|^2 \to 0.$$

The unknown variable (i.e., quantization method) is the integer vector $\alpha$. The objective function for reconstruction error minimization can be put into an alternate form (after removing the irrelevant term $\langle L e | e \rangle$):

$$\Psi^{(rec)} = \langle L^{rec} \alpha | \alpha \rangle - 2 Re\{ \langle L^{(rec)} \alpha | e \rangle \}$$

Note that the reconstruction mean squared error (MSE) of the rounding solution does not improve with increased redundancy after a linear operator. This is primarily because a general linear operator moves components of the kernel of the quantization error into the domain of the synthesis operator.

This situation is avoided in the formulation of the optimization problem with the operator $L^{(linear)}$ to get consistent improvement.

Since each of the operators L is a compact, positive, self-adjoint operator, it has positive real eigenvalues and the eigenvectors that correspond to distinct eigenvalues are orthogonal. Moreover, the space spanned by the eigenvectors represents the domain of L, (i.e., the orthogonal space is ker(L)). Let $\{w_j\}$ be an orthonormal basis of the eigenvectors of L so that $L\,w_j = \lambda_j\,w_j$ where $\lambda_j$ is real and positive. Let $\eta_j = \langle \alpha | w_j \rangle$ and $\zeta_j = \langle e | w_j \rangle$; then the objective function becomes:

$$\Psi^{(rec)} = \left\langle \sum_j \lambda_j \eta_j w_j \,\Big|\, \alpha \right\rangle - 2\mathrm{Re}\left\{ \left\langle \sum_j \lambda_j \eta_j w_j \,\Big|\, e \right\rangle \right\}$$

$$= \sum_j \lambda_j (|\eta_j|^2 - 2\mathrm{Re}\{\eta_j \zeta_j^*\})$$

In the finite dimensional case a positive self-adjoint operator can be represented by a positive semidefinite matrix. The optimization problem in this case is reduced to a standard constrained quadratic integer programming problem (with the constraint that the last element of any feasible solution is one). For infinite dimensional frames we still have the same model but with infinite number of variables. However, we add the constraint that any feasible solution should be in $l^2(Z)$. Therefore we assume that there exists a positive integer N such that $\alpha_j = 0$ for $j > N$.

The optimal solution of the above optimization problem can be computed directly using enumeration for small frame size. For moderate sizes, (e.g., less than 100), the problem can be transformed into a semidefinite programming problem to find a suboptimal solution. However, as size grows it can only be solved using numerical search techniques, e.g., Tabu search. In the following section we describe an efficient heuristic that exploits the optimization model for the overcomplete frames to significantly prune the search space.

9. Approximation

The search procedure described in this section is a reformulation of the objective function for reconstruction error. In particular, we describe a search technique that minimizes the correlation between successive incremental vectors by exploiting the frame redundancy. Since the operator L is a positive self-adjoint operator, it can be written as $L = B^2$ where B is a bounded self-adjoint operator. Let $\{u_j\}$ be the elementary orthonormal basis of $l^2(Z)$, i.e., $u_j(i) = \delta_{i,j}$. Also, define:

$$e_R = B(e)$$

$$b_j = B(u_j)$$

Then using $L = B^2 = B^*B$, the objective function can be written as:

$$\Psi^{(rec)} = \|e^{(rec)}\|^2$$

$$= \langle L(e - \alpha) e - \alpha \rangle$$

$$= \langle B(e - \alpha) | B(e - \alpha) \rangle$$

$$= \|B(e) - B(\alpha)\|^2$$

$$= \left\| e_R - \sum_{j \in J} \alpha_j b_j \right\|^2$$

For overcomplete frames, the set of vectors $\{b_j\}$ are linearly dependent. This redundancy can be exploited to prune the search space of the optimization problem. This is a clustering problem that is discussed in details in the following sections.

10. Clustering Procedure

The objective of the clustering procedure is to cluster the possibly infinite set $\{b_j\}$ from the preceding section to at most M clusters such that the mutual correlations between clusters are minimized. Moreover, each cluster is to have two representatives: one is a vector in $l^2(Z)$ that is used in testing the search increments and the second is a binary vector for elements of $\alpha$.

In particular, given a set of vectors $\{b_j\}$, the preferred embodiment methods generate M clusters with minimal mutual correlation between clusters. Note that in practice we have the original unquantized sequence c in $l^2(Z)$; hence $c_j \to 0$; i.e., for each $\epsilon > 0$, there exists $N(\epsilon)$ such that $|c_j| < \epsilon$ for $j > N(\epsilon)$, which is also dependent upon c. If we choose $\epsilon$ to be much smaller than a single quantization step, we may assume that $\alpha_j = 0$ for $j > N(\epsilon)$. Therefore, we have N vectors and are required to generate M clusters. The solution space of the optimization problem has $2^N$ possible binary solutions $\alpha$. Each cluster corresponds to a search increment in the quantization phase. The preferred embodiment clustering procedure is to minimize the correlations between successive search increments by reducing the overall correlation between clusters. The clustering procedure proceeds as follows:

1) Generate clusters in multiples of $S \leq N$ i.e., we generate S clusters at each iteration.

2) The initial centers of the S clusters at each iteration are an orthonormal basis for $l^2(Z)$ denoted $\{g_j\}$.

3) The first vector by that is classified to the k-th cluster is the vector that maximizes the normalized correlation $|\langle g_k | b_j \rangle|/\|b_j\|$. The cluster vector representative becomes $b_j$ and the binary representative has 1 only in the j-th location and 0 elsewhere. Denote the cluster representative by $h_k$; i.e., initially $h_k = b_j$.

4) For each other vector $b_i$, include it in the k-th cluster when $$|\langle g_k | b_i \pm h_k \rangle|/\|b_i \pm h_k\| > |\langle g_k | h_k \rangle|/\|h_k\|.$$

In this case the cluster representative is updated to $b_i \pm h_k$ and the i-th location in the binary representative vector is updated to 1 with the proper sign.

5) The set of S initial orthonormal vectors $\{g_j\}$ can be generated using Gram-Schmidt procedure on $\{b_j\}$ with different vector order, or by rotating the eigenvectors of the linear operator by a fixed angle using a rotation operator.

Note that the complexity of the clustering procedure is not a critical issue since it is performed offline.

In the finite dimensional case, e.g., $R^N$, the linear operator is approximated by a positive semidefinite matrix $\Gamma$, which in general can be expressed as $\Gamma = B^2$, where B is a hermitian matrix that can be directly computed using a unitary transformation of the Cholesky decomposition of $\Gamma$. In this case the vectors $\{b_j\}$ are simply the columns of B. The number of nonzero vectors equals rank(B) and this equals the maximum number of clusters within a group.

11. Quantization Procedure

At the end of clustering procedure, we have M clusters each with one representative vector $\{h_j\}$ $j = 1, 2, \ldots, M$ and one binary vector for the increment $\{\mu_j\}$ $j = 1, 2, \ldots, M$. The quantization search proceeds as follows:

1) compute $e_R$ as B(e), and set $\alpha = 0$.

2) for $j = 1, 2, \ldots M$, if $\|e_R \pm h_j\| < \|e_R\|$, then replace $e_R$ with $e_R \pm h_j$, and update binary vector $\alpha$ to $\alpha \pm \mu_j$.

3) Step 2 is repeated as needed or until convergence.

Note that the comparison in step 2) can be simplified to:

$|\langle e_R|h_j\rangle| > (½)\|h_j\|^2$

The total computation overhead for the preferred embodiment is as follows:
1) Linear operator computation for computing $e_R$ as B(e).
2) M inner product operations for the search $|\langle e_R|h_j\rangle| > (½)\|h_j\|^2$.

In summary, the preferred embodiment methods include the steps of:
(a) given a frame $\{\phi_n\}$, compute (offline) the $b_j = B(u_j)$;
(b) cluster (offline) the $b_j$ into M clusters with cluster vectors $h_k$ and increment vectors $\mu_k$.
(c) compute frame expansion coefficients $c_j$ for an input signal (i.e., oversampling); the input signal typically would be partitioned into overlapping blocks so the computation is finite and limited delay;
(d) quantize the $c_j$ by the following steps (i) to (iii):
  (i) compute $e_j = c_j - \lfloor c_j \rfloor$ and $e_R = B(e)$;
  (ii) for $j=1, 2, \ldots, M$: when $\|e_R \pm h_j\| < \|e_R\|$, update $e_R$ to $e_R \pm h_j$ and $\alpha$ to $\alpha \pm \mu_j$; ($\alpha$ was initialized as the 0 vector); this cycling through the clusters is repeated until convergence (i.e., no more updates).
  (iii) quantize $c_j$ as $\lfloor c_j \rfloor + \alpha_j$.

Figure 1B:
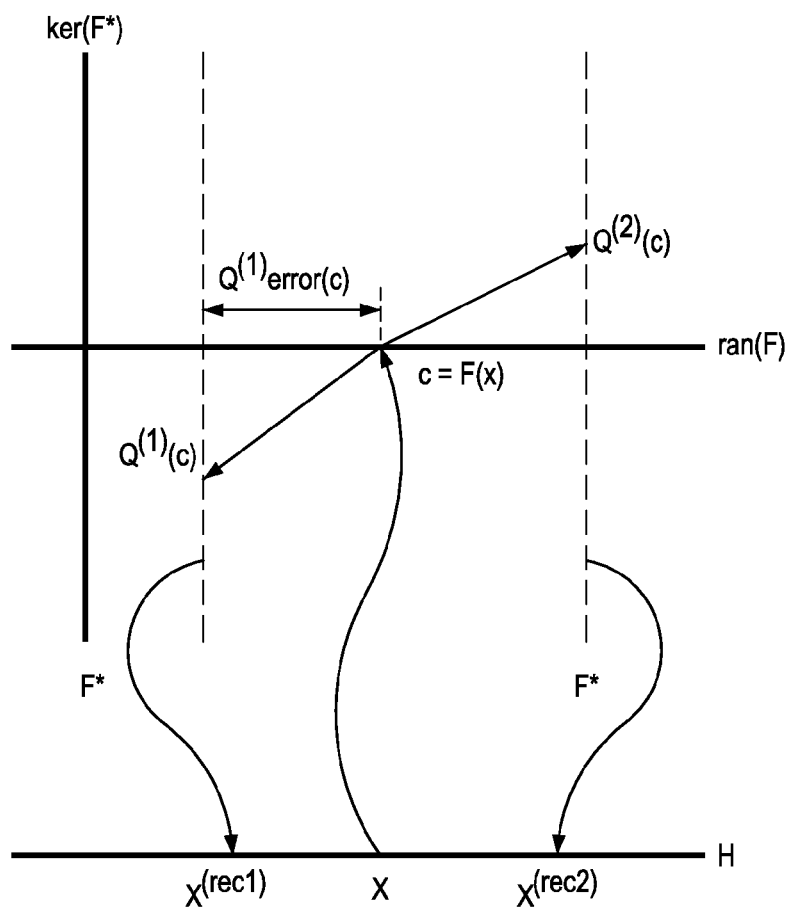

FIG. 1B heuristically illustrates the preferred embodiments: the input analog signal x and two reconstructed analog signals $x^{(rec1)}$ and $x^{(rec2)}$ in H are shown in the lower portion, and the oversampled F(x) plus two possible quantizations in $l^2(Z)$ are shown in the upper portion. The preferred embodiments find the quantization to minimize reconstruction error.

12. Additional

Section 11 described a search technique that is based on minimizing the correlation between successive moves. Unlike the problem of classical integer programming problem where we deal with binary vectors that do not reveal much information, the preferred embodiment uses a clustering technique to work with meaningful vectors to the optimization problem that are the representative for each cluster.

In the case where the delay is a concern (especially in the infinite dimensional case) the clusters can be designed such that the representative binary vector of each cluster is zero outside the allowable delay. Also, the error in a group of S clusters can be reduced by correcting for the additional errors in the following groups of clusters in a procedure that could be considered a generalization of the projection procedure onto the next frame sample that was described in Boufounos and Oppenheim, cited in the background.

As an infinite-dimensional example, consider $L^{(rec)} = FF^*$ of section 5 with T=1 for notational simplicity; then $\phi_n(t) = (1/r)\sin c(t-n/r)$ is the synthesis frame and $\phi_{dual,n}(t) = \sin c(t-n/r)$ is the analysis frame. Compute B as follows. First, $L^{(rec)}(u_j)_k = FF^*(u_j)_k = F(\phi_j(t))_k = \langle \phi_{dual,k}(t)|\phi_j(t)\rangle = (1/r)\sin c(k/r-j/r)$. Next, presume B is translation invariant like L:

$B(c)_k = \Sigma_{n\in Z} \beta_{k-n} c_n$

Then, $L^{(rec)}(u_j)_k = BB(u_j)_k$ implies $(1/r)\sin c(k/r-j/r) = \Sigma_{n\in Z} \beta_{k-n} \beta_{n-j}$ or with a variable change:

$(1/r)\sin c(m/r) = \Sigma_{n\in Z} \beta_{m-n} \beta_n$

Next, Fourier transform $l^2(Z) \to L^2(-½, ½)$ to convert the convolution into a multiplication. Then note the Fourier transform of $(1/r)\sin c(n/r)$ is $rect(r\theta)$ to have $\beta_n = (1/r)\sin c(n/r)$ So the vectors for the cluster computations are:

$b_j(k) = B(u_j)_k$ $= (1/r)\sin c(k/r - j/r)$

Then $\langle b_m|b_n\rangle = \Sigma_{k\in Z}(1/r)\sin c(m/r-k/r)(1/r)\sin c(n/r-k/r) = (1/r)\sin c(m/r-n/r)$, so $\|b_j\|^2 = 1/r$. Intuitively, the oversampling scales down the vector components by a factor of $(1/r)$ to compensate for the redundancy factor r in the expansion; and heuristically the (infinite) dimension of ran(F) is $1/r$ of the total dimension, so for a random vector the projection onto ran(F) decreases the norm by a factor of $1/\sqrt{r}$.

The orthonormal basis $\{g_j\}$ could then be taken as $g_j = (\sqrt{r}) b_{jr}$. Then the first vector in the k-th cluster would be $b_{kr}$ and thus be the initial $h_k$.

For the k-th cluster, vector $b_i$ is included when:

$|\langle g_k|b_i \pm h_k\rangle|/\|b_i \pm h_k\| > |\langle g_k|h_k\rangle|/\|h_k\|$.

Squaring both sides, cross multiplying, and dividing out the square root of r normalization converts the condition into:

$|\langle b_{kr}|b_i \pm b_{kr}\rangle|^2 \|b_{kr}\|^2 > |\langle b_{kr}|b_{kr}\rangle|^2 \|b_i \pm b_{kr}\|^2$.

Divide out $\|b_{kr}\|^2 = |\langle b_{kr}|b_{kr}\rangle|^2$. The left side then equals:

$$|\langle b_{kr}|b_i \pm b_{kr}\rangle|^2 = |\langle b_{kr}|b_i\rangle \pm \langle b_{kr}|b_{kr}\rangle|^2$$

$$= (1/r^2)|\sin c(kr/r-i/r) \pm 1|^2$$

$$= (1/r^2)[\sin c(kr/r-i/r)^2 \pm 2\sin c(kr/r-i/r) + 1]$$

The right side equals $$\|b_i \pm b_{kr}\|^2 = \|b_i\|^2 \pm 2\langle b_i|b_{kr}\rangle + \|b_{kr}\|^2$$

$$= (1/r^2)[1 \pm 2\sin c(kr/r-i/r) + 1]$$

The left side is always smaller because $\sin c(kr/r-i/r)^2 < 1$; thus the clusters have a single representative, and the quantization search is simply over the vectors corresponding to samples of lowpass-filtered pulses at the Nyquist rate.

13. Experimental Results

In our simulation we use a finite dimensional Hilbert space generated by the Fourier series coefficients of periodic band-limited functions as in Goyal et al., Quantized Overcomplete Expansions in $R^N$: Analysis, Synthesis, and Algorithms, 44 IEEE Tran. Info Theory 16 (January 1998). In particular, a real-valued function x(t) with period T, integrable over [0, T], and with maximum frequency W can be expanded in a finite Fourier series:

$x(t) = X(1) + \Sigma_{1\leq k\leq W} X(2k)\sqrt{2} \cos[2\pi kt/T] + X(2k+1)\sqrt{2} \sin[2\pi kt/T]$ Thus take the Hilbert space H as $R^N$ where N=2W+1 and the function x(t) is represented by the vector $$\begin{bmatrix} X(1) \\ X(2) \\ X(3) \\ \ldots \\ X(N) \end{bmatrix}$$

in H. Now samples of x(t) at M equi-spaced points in [0, T] can be written as:

$x(mT/M)=X(1)+\Sigma_{1 \le k \le W}X(2k)\sqrt{2}\cos[2\pi km/M]+X(2k+1)\sqrt{2}\sin[2\pi km/M]$ where m=0, 1, 2, ..., M−1 (or equivalently by periodicity, m=1, 2, ..., M). Denote these samples as a vector c in $R^M$ (which replaces $l^2(Z)$ in this finite-dimensional case) with components $c_m$=x(mT/M). Oversampling corresponds to M>N. And the samples can be written as inner products in H:

$c_m = \langle X | \varphi_m \rangle$
where $$\varphi_m = \begin{bmatrix} 1 \\ \sqrt{2}\cos[2\pi m/M] \\ \sqrt{2}\sin[2\pi m/M] \\ \ldots \\ \sqrt{2}\sin[2\pi Wm/M] \end{bmatrix}$$

Figure 2A:
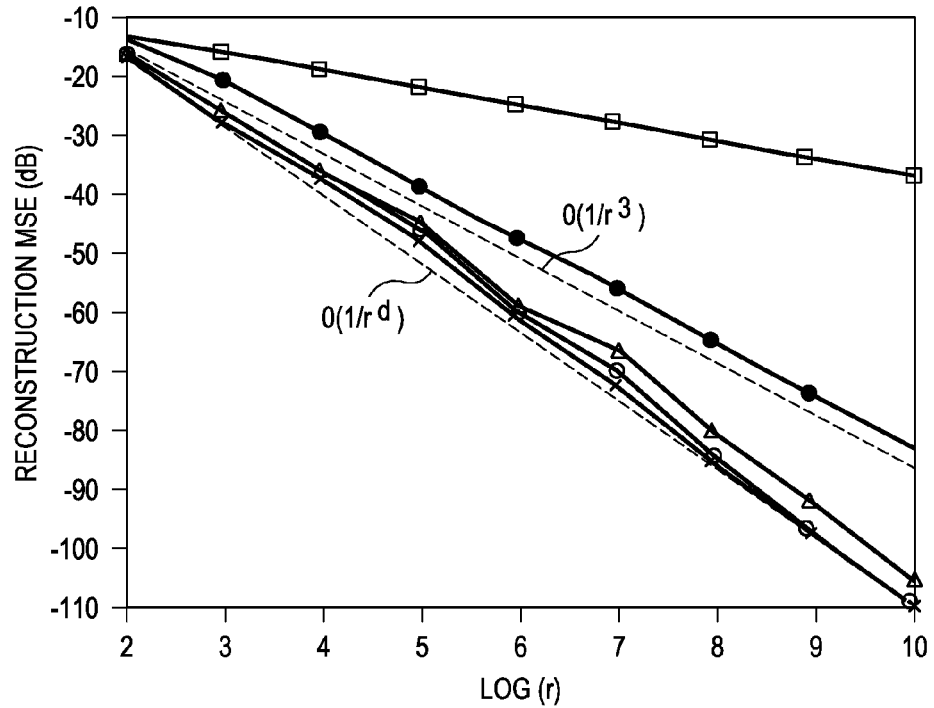
FIGS. 2A-2B are experimental results.

The $\{\phi_m\}$ form the frame in H, and then the frame analysis operator F: $H \to R^M$ maps $X \to c$ where $c_m = \langle X|\phi_m \rangle$. Thus F corresponds to the M×N matrix with elements $F_{m,1}=1$, $F_{m,2k}=\sqrt{2}\cos[7\pi km/M]$, and $F_{m,2k+1}=\sqrt{2}\sin[2\pi km/M]$; that is, the m-th row of F is $\phi_m$. The frame synthesis operator F*: $R^M \to H$ maps $c \to Y$ where $Y(1)=\Sigma_{1 \le m \le M} c_m$, $Y(2k) = \Sigma_{1 \le m \le M} c_m \sqrt{2}\cos[2\pi km/M]$, $Y(2k+1) = \Sigma_{1 \le m \le M} c_m \sqrt{2}\sin[2\pi km/M]$, F* corresponds to the N×M matrix which is the adjoint of the F matrix so the columns of F* are the $\{\phi_m\}$, and $F^*F=M\,I_{N \times N}$. Further, the optimization operator L=FF*: $R^M \to R^M$ corresponds to the M×M matrix with elements $\langle \phi_n | \phi_m \rangle$. Note that $\langle \varphi_n | \varphi_m \rangle = 1 + 2(\cos[2\pi m/M]\cos[2\pi n/M] + \sin[2\pi m/M]\sin[2\pi n/M]) +$ $2(\cos[2\pi 2m/M]\cos[2\pi 2n/M] + \sin[2\pi 2m/M]\sin[2\pi 2n/M]) + \ldots +$ $2(\cos[2\pi km/M]\cos[2\pi kn/M] + \sin[2\pi km/M]\sin[2\pi kn/M]) + \ldots +$ $2(\cos[2\pi Wm/M]\cos[2\pi Wn/M] + \sin[2\pi Wm/M]\sin[2\pi Wn/M])$ Then using the cosine addition formula:

$\langle \varphi_n | \varphi_m \rangle = 1 + 2\cos[2\pi(m-n)/M] + 2\cos[2\pi 2(m-n)/M] + \ldots +$ $2\cos[2\pi k(m-n)/M] + \ldots + 2\cos[2\pi W(m-n)/M]$ $= \sin[2\pi(W+1/2)(m-n)/M]/\sin[2\pi(1/2)(m-n)/M]$ $= \sin[\pi N(m-n)/M]/\sin[\pi(m-n)/M]$ The test vectors in $R^N$ are Gaussian independent, identically-distributed sequences with unity variance. The frame functions $\{\phi_m\}$ in the synthesis process are not quantized. In the first experiment, we establish the effectiveness of the preferred embodiment search method as described in section 11. We fix N=4, and increase the redundancy factor r. We set the number of reduced search vectors in $R^N$ to M=N×r (compared to the total search space of $2^M$). The M search vectors are generated as described in section 10. In a single iteration we have M search steps as described in section 11. To evaluate the preferred embodiment method, we simulate the results of Boufounos and Oppenheim (cited in the background) for frame quantization by projecting the quantization error onto the following frame coefficient. The results are shown in FIG. 2A.

The preferred embodiment search method gives significant improvement in the reconstruction mean square error (MSE) over the rounding solution. Note that the rounding solution has an error behavior almost O(1/r) which is proportional to the dimension of ker(F*). The preferred embodiment search method with the described parameters performs better than the projection algorithm in Boufounos and Oppenheim which simulates the sigma-delta quantization for redundant frames, therefore, the SNR is $O(1/r^3)$ as it resembles the error behavior of a single stage sigma-delta converter. On the other hand, the error behavior of the preferred embodiment is approximately $O(1/r^4)$ which is a significant improvement. This performance is typical for any frame order. One other important point from the figure is that most of the improvement occurs in the first iteration. This is due to the efficient procedure for constructing the search movements with orthogonal sets. Note that, the described order of iterations of the preferred embodiment search method is several orders of magnitude less than typical search algorithms for integer programming problems.

Figure 2B:
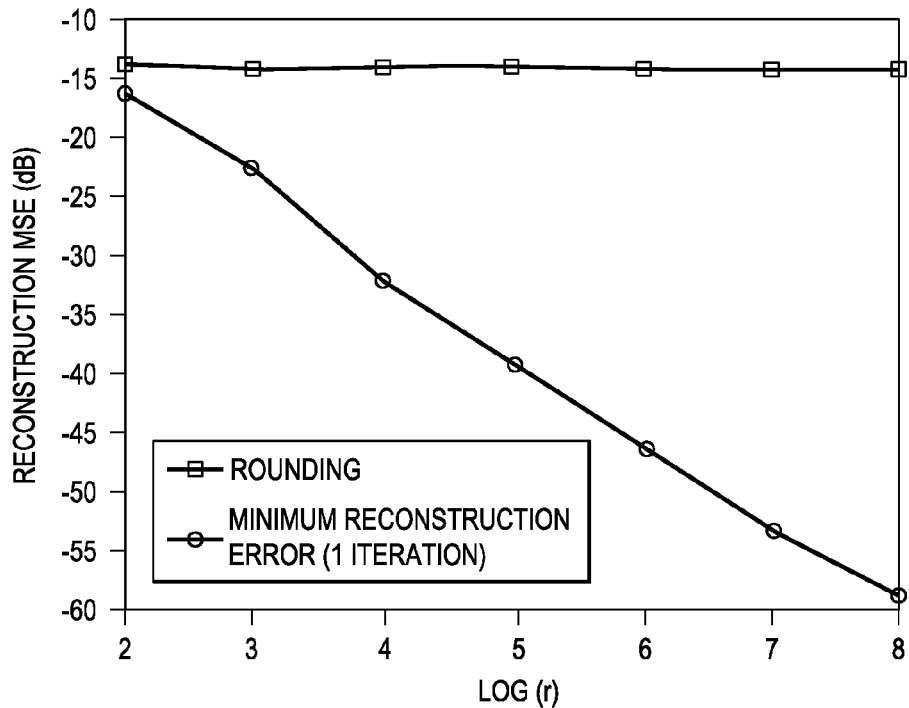

Next we test the performance when the frame coefficients undergo a linear operation. In particular, we multiply the frame coefficients in $R^M$ by an M×M matrix with uniformly distributed entries. We use the optimization model described in section 6. The results are illustrated and compared with the rounding solution in FIG. 2B which has similar behavior to the first experiment.

Note that the reconstruction MSE of the rounding solution does not improve with increased redundancy after a linear operator. This is primarily because a general linear operator moves kernel components of the quantization error to the domain of the synthesis operator. This situation is avoided in the formulation of the optimization problem in section 6 to get the consistent improvement.

What is claimed is:

1. A quantization method for oversampled signals, wherein the quantization method produces enhanced images, comprising:
   (a) pruning search space by exploiting redundancy, wherein the pruning results in minimizing searches based upon clusters of possible sampling vectors, wherein the clustering is done offline;
   (b) minimizing correlation based on the minimized searches;
   (c) decreasing reconstruction error as a function of oversampling ratio based on clusters of sampling vectors; and
   (d) wherein the quantization is modeled as a nonlinear integer over an infinite space.

2. The method of claim 1, wherein the pruning of the searches comprises:
   (a) utilizing a cluster comprising a vector for choosing a variance cluster
   (b) computing the two least similar clusters in the variance cluster
   (c) splitting the variance clusters into two clusters with each vector in each cluster
   (d) classifying the vectors originally in the variance cluster to one of the two new clusters
   (e) repeating steps (a)-(d) until a target cluster number is reached.

3. The method of claim 2, wherein the cluster comprises all relevant vectors.

4. The method of claim 2, wherein the variance cluster is the highest cluster.

* * * * *